(12) United States Patent
Taira

(10) Patent No.: US 11,417,404 B2
(45) Date of Patent: Aug. 16, 2022

(54) SEMICONDUCTOR STORAGE DEVICE

(71) Applicant: Kioxia Corporation, Tokyo (JP)

(72) Inventor: Takashi Taira, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/183,958

(22) Filed: Feb. 24, 2021

(65) Prior Publication Data

US 2022/0051731 A1 Feb. 17, 2022

(30) Foreign Application Priority Data

Aug. 17, 2020 (JP) .............................. JP2020-137608

(51) Int. Cl.
| G11C 16/12 | (2006.01) |
| G11C 16/30 | (2006.01) |
| G11C 16/24 | (2006.01) |
| G11C 16/08 | (2006.01) |

(52) U.S. Cl.
CPC .............. *G11C 16/30* (2013.01); *G11C 16/08* (2013.01); *G11C 16/24* (2013.01)

(58) Field of Classification Search
CPC ......... G11C 16/30; G11C 16/08; G11C 16/24; G11C 5/025; G11C 16/0483; H01L 27/11531
See application file for complete search history.

(56) References Cited

U.S. PATENT DOCUMENTS

| 8,270,220 | B2* | 9/2012 | Shiino .................... G11C 16/30 365/185.18 |
| 9,515,083 | B2* | 12/2016 | Lee .................... H01L 27/11582 |
| 2014/0085979 | A1 | 3/2014 | Kono |
| 2015/0270279 | A1 | 9/2015 | Arigane et al. |
| 2016/0148690 | A1* | 5/2016 | An ..................... G11C 16/0483 365/185.11 |
| 2018/0337193 | A1 | 11/2018 | Lim et al. |
| 2019/0043868 | A1 | 2/2019 | Hasnat et al. |
| 2020/0135759 | A1* | 4/2020 | Choi ................. H01L 27/11568 |

* cited by examiner

*Primary Examiner* — Hien N Nguyen
(74) *Attorney, Agent, or Firm* — Foley & Lardner LLP

(57) ABSTRACT

A semiconductor storage device includes a memory cell unit which includes memory cell arrays including a plurality of memory cells; a peripheral circuit which performs voltage transmission control including a write operation, a read operation, and an erasing operation with respect to the memory cell unit; and signal lines which connect the peripheral circuit to the memory cell unit, and at least a portion of the signal lines is formed in a non-facing region, the non-facing region being a region where the memory cell unit does not face the peripheral circuit, the non-facing region being in a peripheral region formed around a periphery of the memory cell arrays of the memory cell unit.

11 Claims, 9 Drawing Sheets

SEMICONDUCTOR STORAGE DEVICE

CROSS-REFERENCE TO RELATED APPLICATION

This application is based upon and claims the benefit of priority from Japanese Patent Application No. 2020-137608, filed on Aug. 17, 2020, the entire contents of which are incorporated herein by reference.

FIELD

Embodiments described herein relate generally to a semiconductor storage device.

BACKGROUND

In a semiconductor storage device, memory cell arrays including a plurality of memory cells and peripheral elements that control the memory cell arrays are disposed at a certain distance. In a region between the memory cell arrays and the peripheral elements, row decoders including a plurality of block decoders and page buffers are disposed, word lines connected to the row decoders pass through, and bit lines connected to the page buffers pass through.

DETAILED DESCRIPTION

Figure 1:
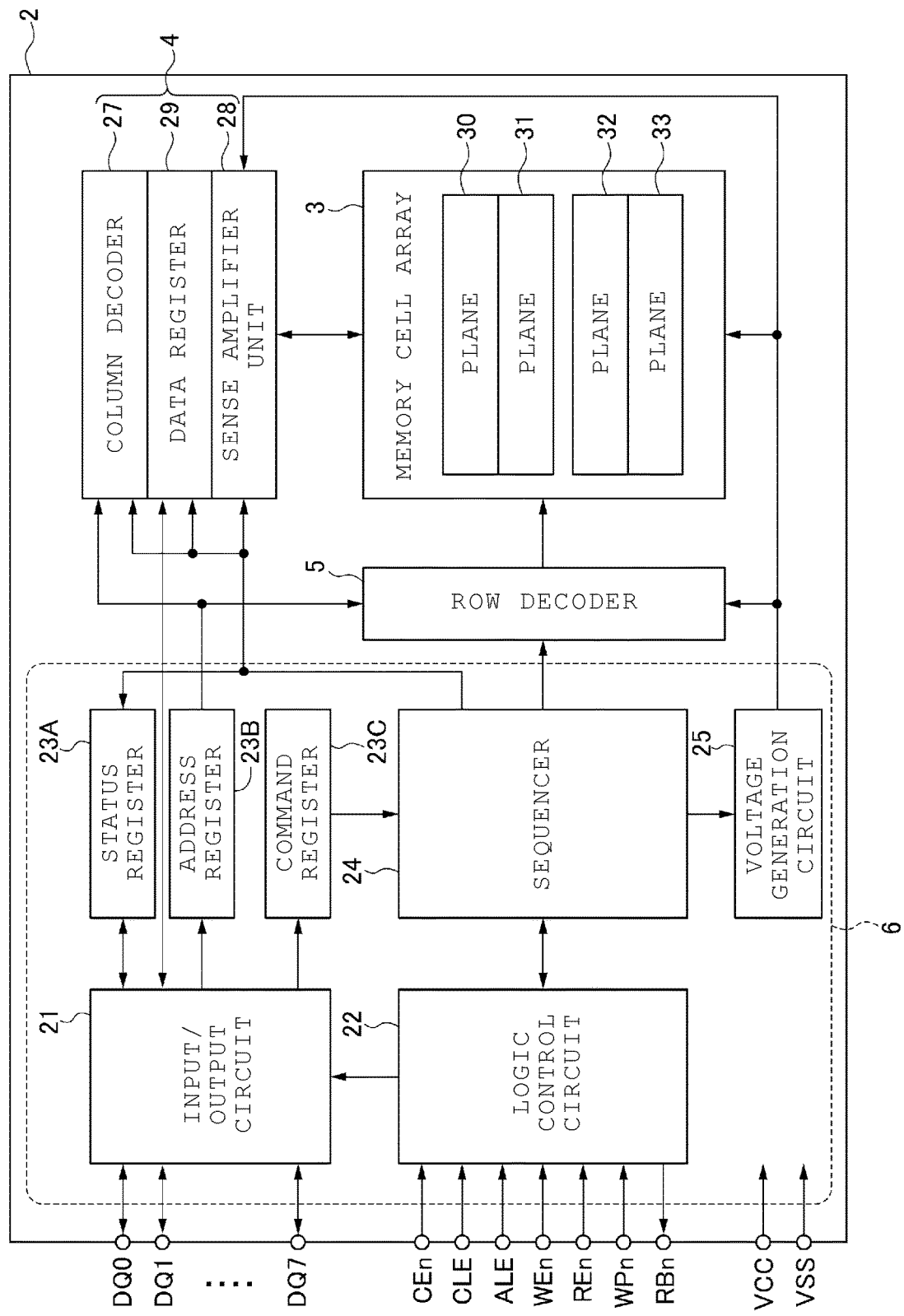
FIG. 1 is a block diagram of a NAND-type flash memory according to at least one embodiment.

As a semiconductor storage device becomes multifunctional to increase the number of row decoders and page buffers, the number of word lines and bit lines also increases, and the chip size increases.

At least one embodiment provides a semiconductor storage device that can prevent the increase of the chip size even if the semiconductor storage device becomes multifunctional.

In general, according to at least one embodiment, there is provided a semiconductor storage device including a memory cell unit including a plurality of memory cell arrays; a peripheral circuit which performs voltage transmission control including a write operation, a read operation, and an erasing operation with respect to the memory cell unit; and signal lines connected to the peripheral circuit and the memory cell unit, at least a portion of the signal lines is formed in a non-facing region, the non-facing region being a region where the memory cell unit does not face the peripheral circuit, non-facing region being in a peripheral region formed around a periphery of the memory cell arrays of the memory cell unit.

According to at least one embodiment, it is possible to provide a semiconductor storage device that can prevent the increase of the chip size even if the semiconductor storage device becomes multifunctional.

Hereinafter, embodiments are described with reference to the drawings. Some of the embodiments described below exemplify devices and methods for embodying the technical idea of the present embodiment, and the technical idea of at least one embodiment is not specified by the shape, the structure, the arrangement, and the like of the component parts. Each functional block may be implemented by a combination of hardware and software, or both. It is not essential that each functional block be distinguished as in the example below. For example, some functions may be executed by a functional block different from the exemplified functional block. The exemplified functional block may be divided into finer functional subblocks. In the following description, elements having the same function and configuration are designated by the same reference numerals, and duplicate explanations will be given only when necessary.

The NAND-type flash memory, which is the semiconductor storage device according to at least one embodiment, is described with reference to FIG. 1. FIG. 1 is a block diagram of a NAND-type flash memory 2 according to at least one embodiment.

The NAND-type flash memory 2 includes a memory cell unit 3, an input/output circuit 21, a logic control circuit 22, a status register 23A, an address register 23B, a command register 23C, a sequencer 24, a voltage generation circuit 25, a row decoder 5, a column decoder 27, a sense amplifier unit 28, and a data register 29.

The memory cell unit 3 includes a plurality of planes. In FIG. 1, for example, four planes 30, 31, 32, and 33 are illustrated. Each of the plurality of planes includes a plurality of memory cell transistors. In the memory cell unit 3, a plurality of bit lines, a plurality of word lines, and a source line are provided, in order to apply a voltage to the memory cell transistors. A specific configuration of the plane is described below.

The input/output circuit 21 and the logic control circuit 22 are connected to a memory controller (not illustrated) via a NAND bus (not illustrated). The input/output circuit 21 transmits and receives signals DQ (for example, DQ0 to DQ7) to and from a memory controller via a NAND bus.

The logic control circuit 22 receives an external control signal (for example, a chip enable signal CEn, a command latch enable signal CLE, an address latch enable signal ALE, a write enable signal WEn, a read enable signal REn, and a write protect signal WPn) from a memory controller 3 via a NAND bus. "n" added to the signal name indicates active low. The logic control circuit 22 transmits a ready/busy signal RBn to the memory controller 3 via a NAND bus.

The signal CEn can select the NAND-type flash memory 2 and is asserted when the NAND-type flash memory 2 is selected. The signal CLE can latch a command transmitted as the signals DQ to a command register. The signal ALE can latch an address transmitted as the signals DQ to an address register. The signal WEn can be written. The signal REn can be read. The signal WPn can be asserted when writing or erasing is prohibited. The signal RBn indicates whether the NAND-type flash memory 2 is in a ready state (a state in which an instruction from the outside can be received) or a busy state (a state in which an instruction from the outside cannot be received). The memory controller 3 can know the state of the NAND-type flash memory 2 by receiving the signal RBn from the NAND-type flash memory 2.

The status register 23A temporarily stores data required for the operation of the NAND-type flash memory 2. The address register 23B temporarily stores an address. The command register 23C temporarily stores a command. The status register 23A, the address register 23B, and the command register 23C are configured with, for example, an SRAM.

The sequencer 24 receives the command from the command register 23C and comprehensively controls the NAND-type flash memory 2 according to a sequence based on this command.

The voltage generation circuit 25 receives a power supply voltage from the outside of the NAND-type flash memory 2 and generates a plurality of voltages required for the write operation, the read operation, and the erasing operation by using this power supply voltage. The voltage generation circuit 25 supplies the generated voltage to the memory cell unit 3, the row decoder 5, the sense amplifier unit 28, and the like.

The row decoder 5 receives a row address from the address register 23B and decodes this row address. The row decoder 5 performs a selection operation such as a word line based on the decoded row address. The row decoder 5 transmits a plurality of voltages required for the write operation, the read operation, and the erasing operation to the memory cell unit 3.

The column decoder 27 receives a column address from the address register 23B and decodes this column address. The column decoder 27 performs a selection operation of a bit line based on the decoded column address.

The sense amplifier unit 28 detects and amplifies data read from the memory cell transistor to the bit line during the read operation. The sense amplifier unit 28 transmits data to be written to the bit line during the write operation.

The data register 29 temporarily stores data transmitted from the sense amplifier unit 28 during the read operation and serially transmits the data to the input/output circuit 21. The data register 29 temporarily stores data serially transmitted from the input/output circuit 21 during the write operation and transmits in parallel the data to the sense amplifier unit 28. The data register 29 is configured with an SRAM or the like.

A power supply voltage VCC and a ground voltage VSS are applied to the NAND-type flash memory 2 via a corresponding terminal. In the description of at least one embodiment, the input/output circuit 21, the logic control circuit 22, the status register 23A, the address register 23B, the command register 23C, the sequencer 24, and the voltage generation circuit 25 are referred to as a peripheral circuit 6. The column decoder 27, the sense amplifier unit 28, and the data register 29 are referred to as page buffers 4 in at least one embodiment. A portion of components from the peripheral circuit 6 may be omitted, and other components (not illustrated) may be combined in at least one embodiment. A portion of components from the page buffers 4 may be omitted, and other components (not illustrated) may be combined in at least one embodiment.

Figure 2:
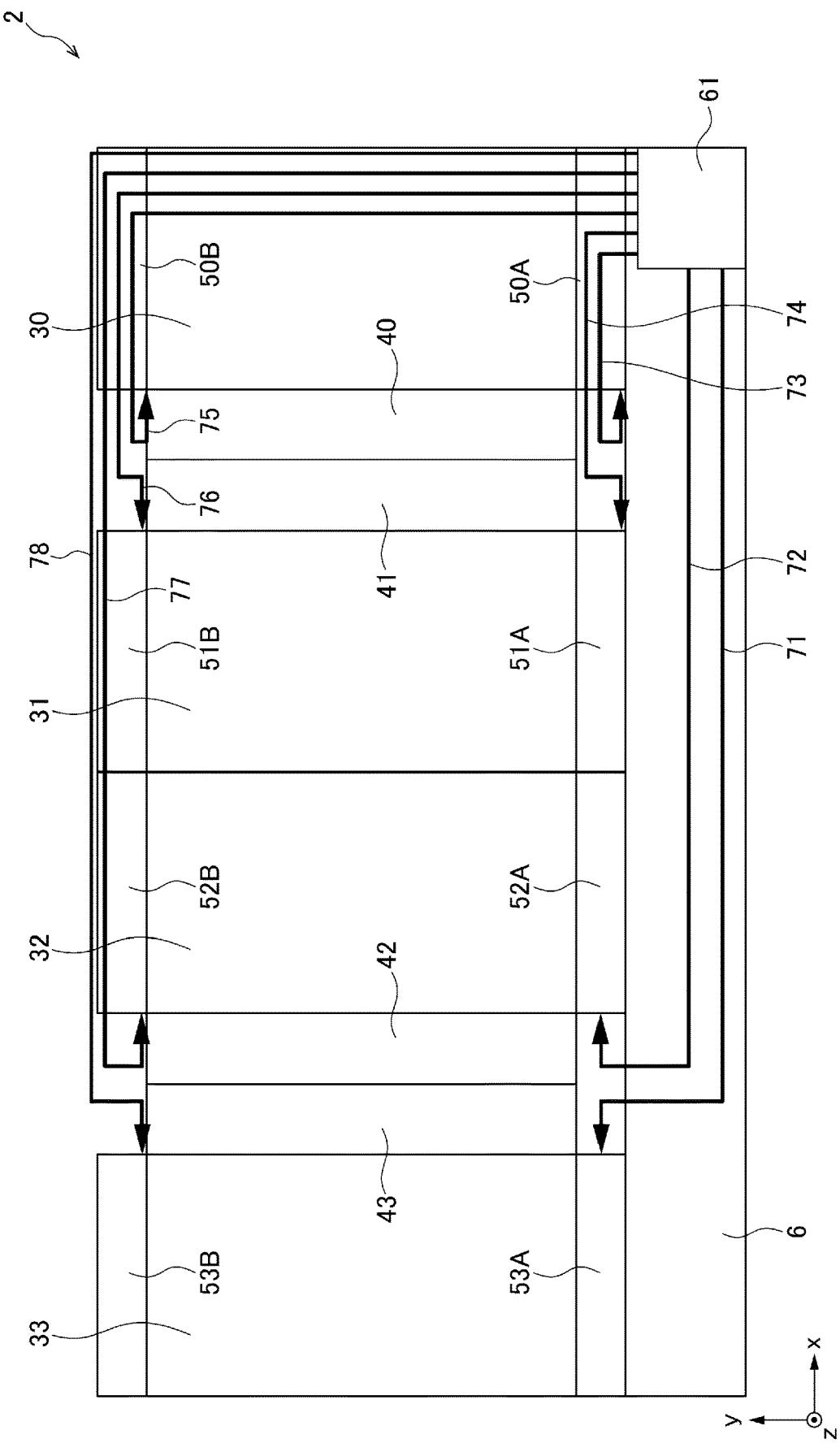
FIG. 2 is a diagram illustrating a configuration of a plane in the memory cell array illustrated in FIG. 1.
Figure 3:
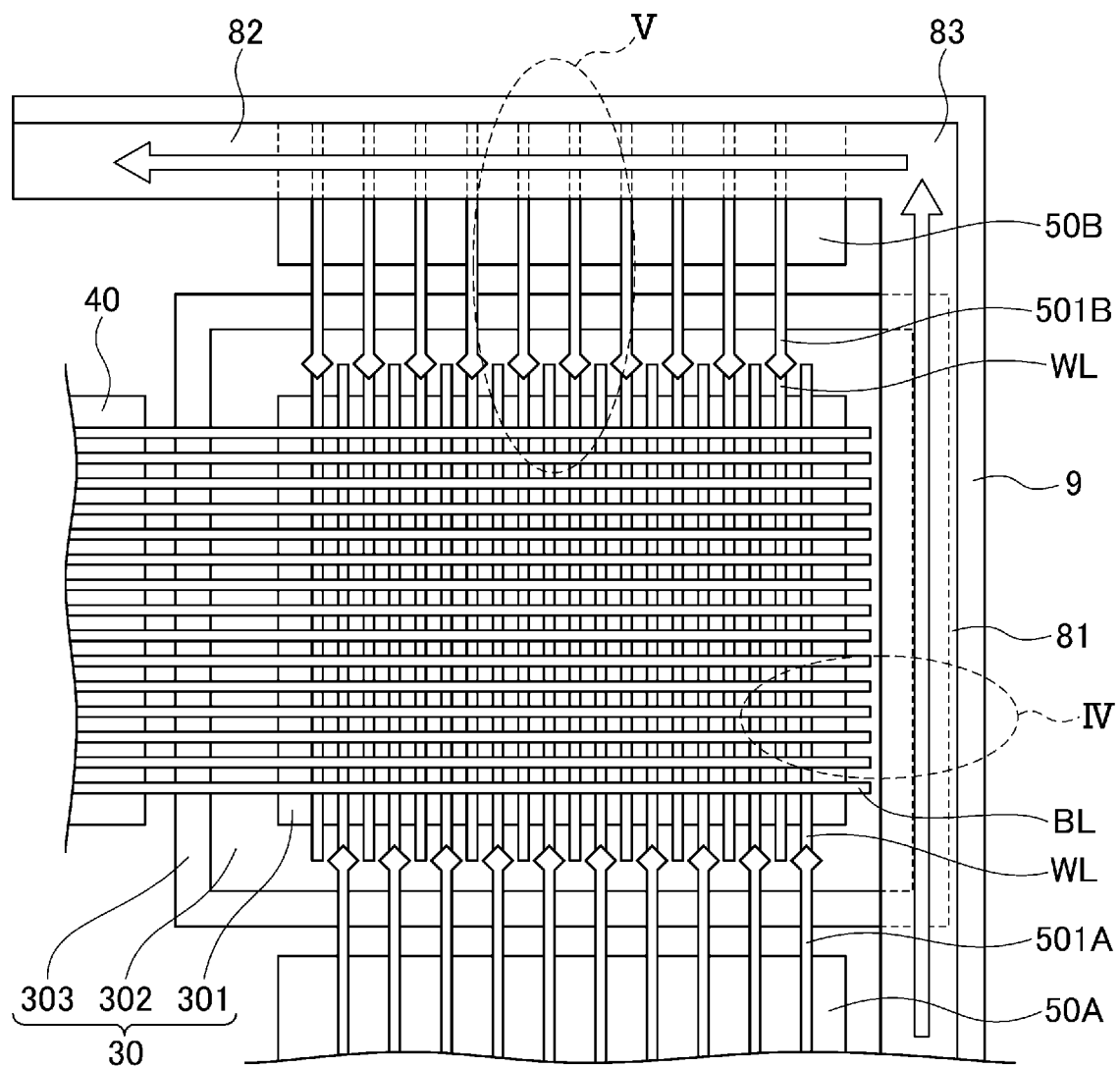
FIG. 3 is a diagram illustrating one plane of a memory cell array illustrated in FIG. 2.

Subsequently, with reference to FIG. 2, the planes 30, 31, 32, and 33 are described. Each of the planes 30, 31, 32, and 33 includes the plurality of blocks (not illustrated in FIG. 2). Each of the blocks includes the plurality of memory cells (not illustrated in FIG. 2). In FIG. 2, a direction which is parallel from the plane 33 to the planes 32, 31, and 30 and is along the paper surface of FIG. 2 is set as an x axis. A direction which is orthogonal to the x axis, directs from a row decoder 50A to a row decoder 50B described below, and is along the paper surface of FIG. 2 is set as a y axis. A direction which is orthogonal to the x axis and the y axis and penetrates the paper surface of FIG. 2 toward the front side is set as a z axis. In FIG. 3 and subsequent figures, the description is appropriately made by using the x axis, the y axis, and the z axis which are set in the same manner.

The row decoders 5 and the page buffers 4 are set for each plane. The row decoders 50A and 50B and a page buffer 40 are provided on the plane 30. The row decoders 51A and 51B and the page buffers 41 are provided on the plane 31. The row decoders 52A and 52B and the page buffers 42 are provided on the plane 32. The row decoders 53A and 53B and the page buffers 43 are provided on the plane 33.

Signals are output from the control unit 61 in the peripheral circuit 6 to the row decoders 50A, 50B, 51A, 51B, 52A, 52B, 53A, and 53B and the page buffers 40, 41, 42, and 43. The control unit 61 includes, for example, the sequencer 24.

The control unit 61 is connected to the row decoders 53A and the page buffers 43 via a signal line 71. The control unit 61 is connected to the row decoder 52A and the page buffers 42 via a signal line 72.

The control unit 61 is connected to the row decoder 51A and the page buffers 41 via a signal line 74. The control unit 61 is connected to the row decoder 50A and the page buffer 40 via a signal line 73. The signal lines 73 and 74 are wired to overlap the row decoder 50A.

The control unit 61 is connected to the row decoder 50B via a signal line 75. The control unit 61 is connected to the row decoder 51B via a signal line 76. The control unit 61 is connected to the row decoder 52B via a signal line 77. The control unit 61 is connected to the row decoder 53B via a signal line 78.

At least a portion of signal lines 75, 76, 77, and 78 extending from the control unit 61 passes through a non-facing region where the plane 30, which is a portion of the memory cell unit 3, does not face the peripheral circuit 6. The signal lines 71, 72, 73, 74, 75, 76, 77, and 78 are not limited to single signal lines, and may be bundles of a plurality of signal lines.

Wiring near the plane 30 is described with reference to FIG. 3. FIG. 3 is a diagram illustrating a portion near the plane 30. The plane 30 includes a memory cell array 301, an intermediate region 302, and a guard ring 303. A plurality of memory cells (not illustrated in FIG. 3) are provided in the memory cell array 301.

Word lines WL and bit lines BL are provided in the memory cell array 301 in a grid shape to correspond to the memory cells. The word lines WL are alternately connected to connection wirings 501A and 501B. The connection wirings 501A are connected to the row decoder 50A. The connection wirings 501B are connected to the row decoder 50B. The bit lines BL are connected to the page buffer 40.

A chip edge 9 surrounds the plane 30 and the row decoders 50A and 50B. Wiring regions 81, 82, and 83 are provided between the memory cell array 301 and the chip edge 9. Specifically, the wiring regions 81, 82, and 83 are provided between the memory cell array 301 and the guard ring 303 to correspond to the intermediate region 302.

Figure 4:
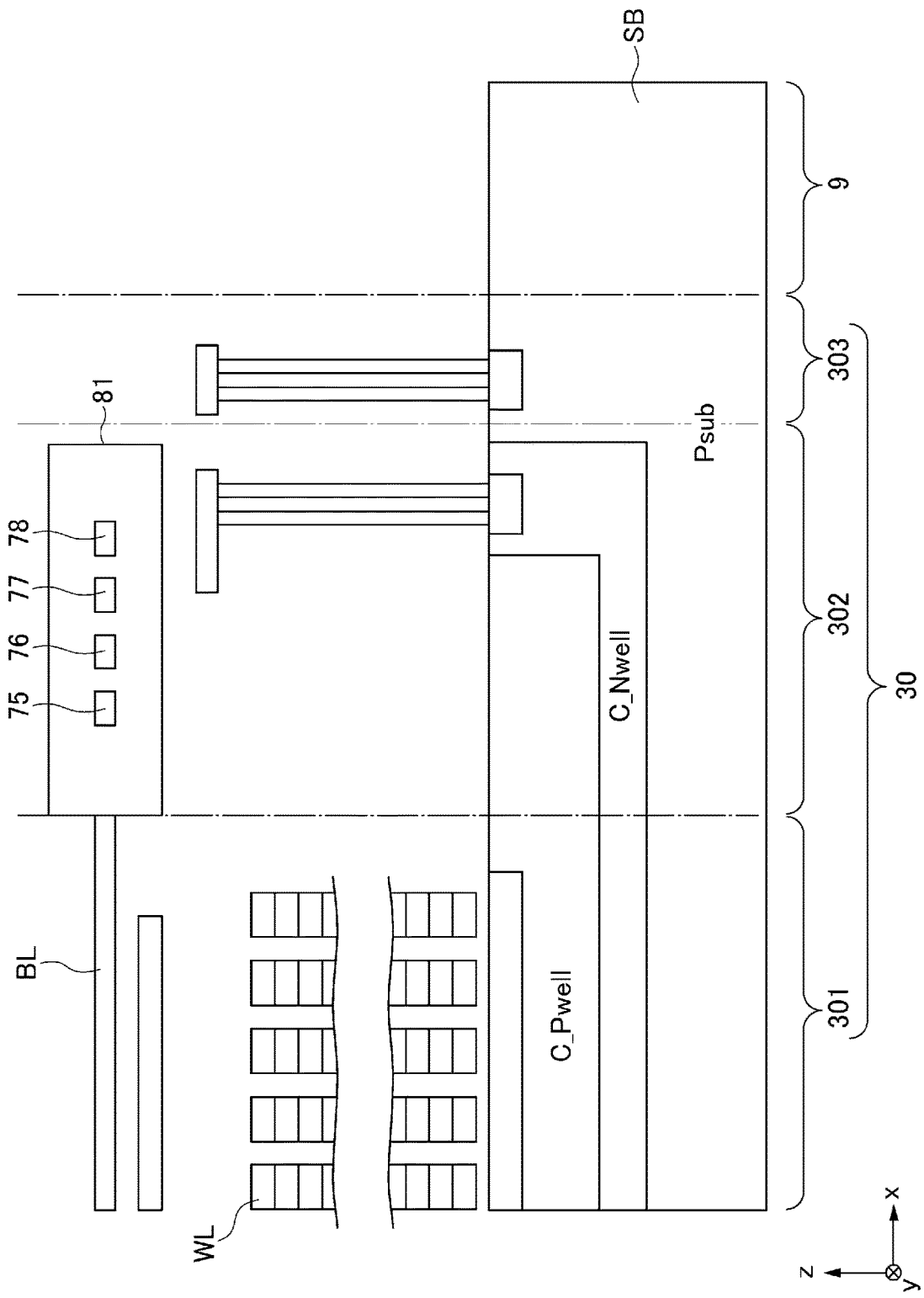
FIG. 4 is a diagram illustrating a wiring region illustrated in FIG. 3.

FIG. 4 is a view illustrating a cross section that includes the x axis and the z axis in an IV portion of FIG. 3 and is viewed from the negative direction to the positive direction of the y axis. The signal lines 75, 76, 77, and 78 are wired in the wiring region 81. The wiring region 81 is provided on the bit line BL side seen from a substrate SB side. The bit line BL is provided so that the end portion does not enter the intermediate region 302. The wiring region 81 is provided from the end portion of the bit line BL to a C_Nwell region. For example, the wiring region 81 and the bit line BL are provided on the same layer. Therefore, the wiring region 81 and the bit line BL do not overlap with each other, and thus it is not likely that the signal lines 75, 76, 77, and 78 in the wiring region 81 receive the influence of noise from the bit line BL.

Figure 5:
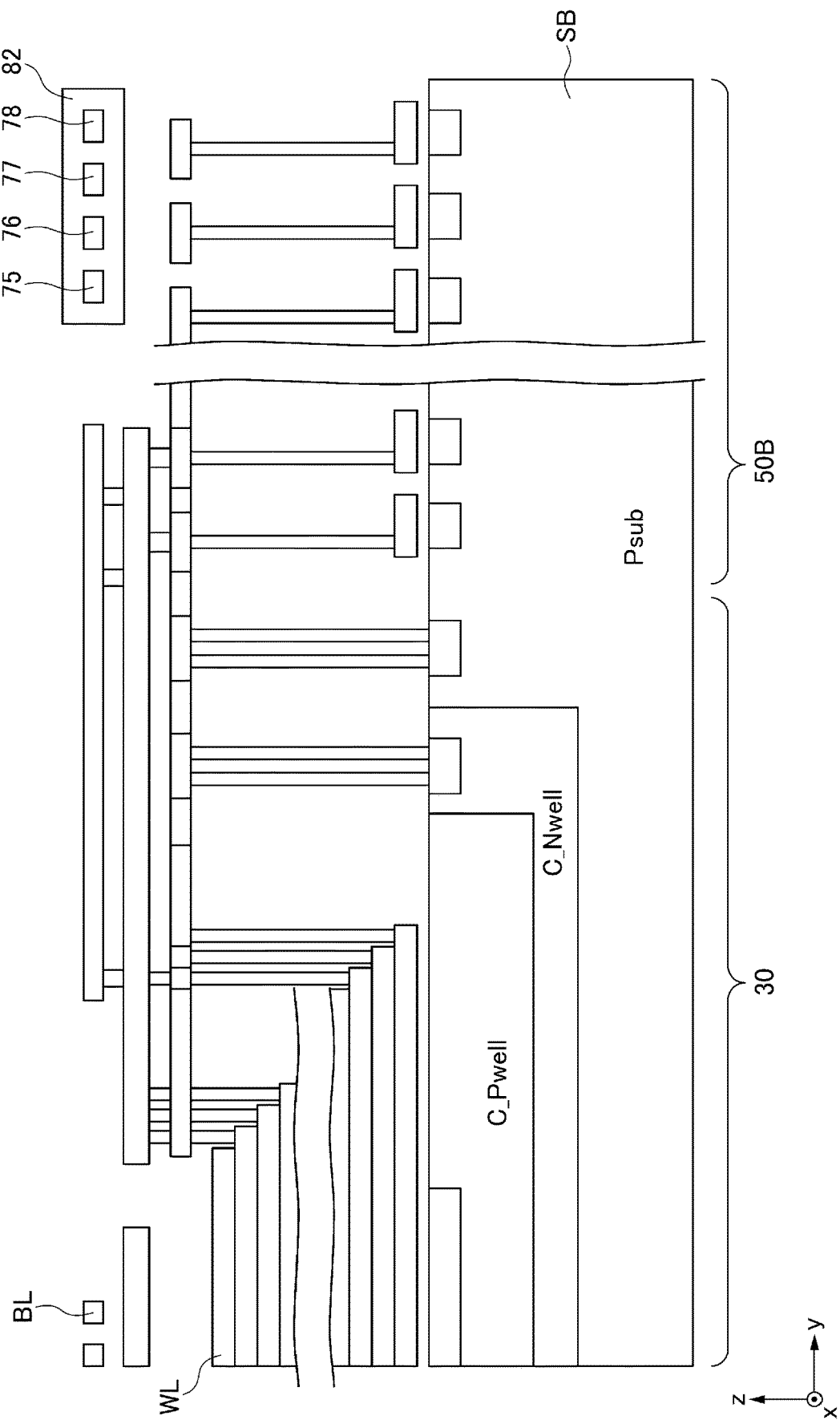
FIG. 5 is a diagram illustrating the wiring region illustrated in FIG. 3.

FIG. 5 is a diagram illustrating a cross section that includes the y axis and the z axis in a V portion of FIG. 3 and is viewed from the positive direction to the negative direction of the x axis. The signal lines 75, 76, 77, and 78 are wired in the wiring region 82. The wiring region 82 overlaps a portion of the row decoder 50B.

Figure 9:
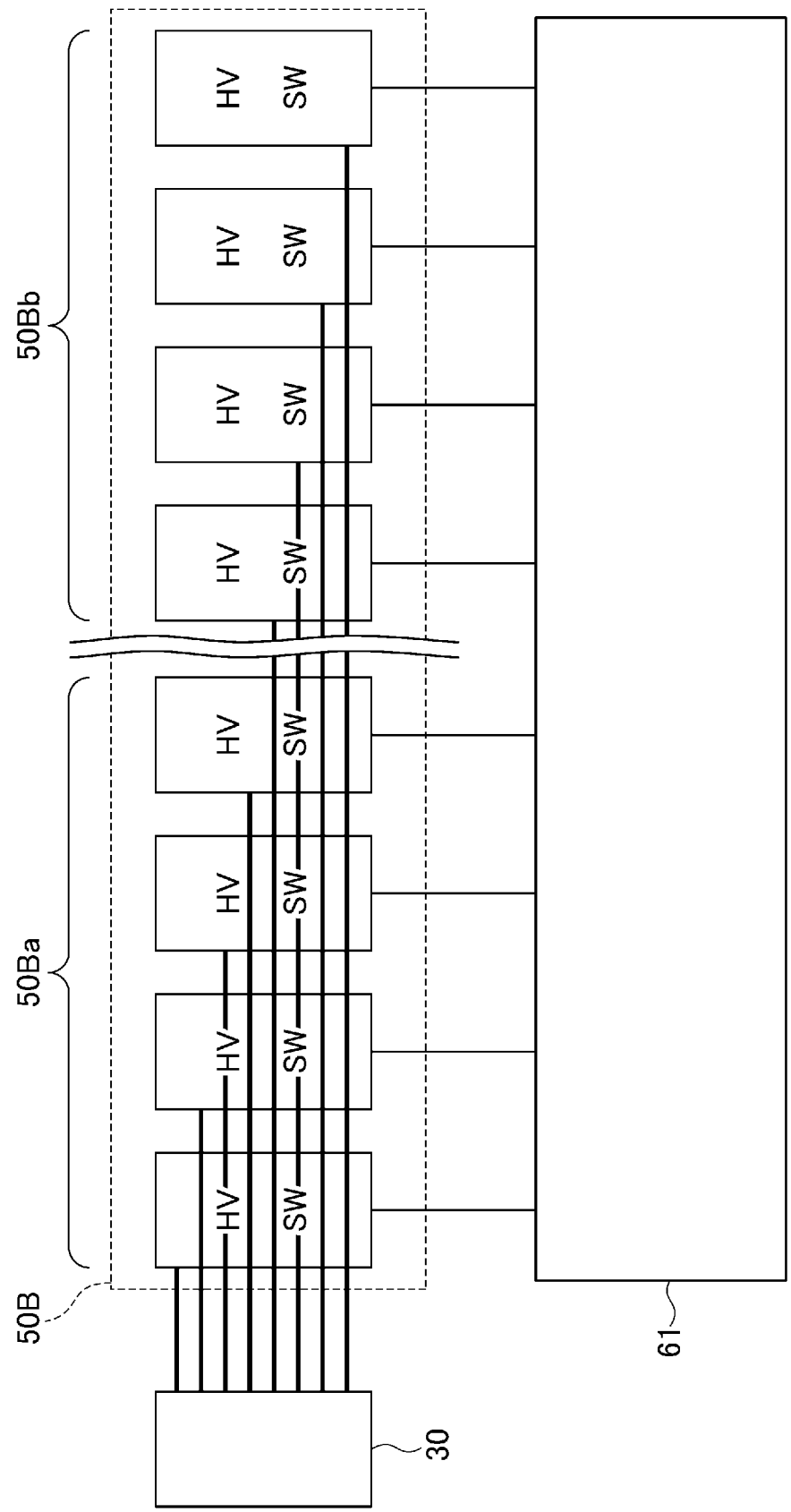
FIG. 9 is a diagram illustrating an example of wiring to be overlapped with a row decoder.

A region where the wiring region 82 and the row decoder 50B overlap with each other is described with reference to FIG. 9. FIG. 9 is a diagram illustrating a wiring situation inside the row decoder 50B.

As illustrated in FIG. 9, the row decoder 50B is connected to the plane 30 and the control unit 61. A plurality of block decoders are provided in the row decoder 50B and are respectively connected to the blocks in the plane 30 one by one. Accordingly, the number of the wirings in the row decoder 50B decreases as the wirings are farther from the plane 30.

The row decoder 50B includes a first region 50Ba having a high wiring density and a second region 50Bb having a wiring density lower than the first region 50Ba. The first region 50Ba includes both of the wirings that are connected to a plurality of block decoders in the first region 50Ba and wirings that pass through the first region 50Ba and are connected to a plurality of block decoders in the second region 50Bb. However, the second region 50Bb only includes the wirings that are connected to the plurality of block decoders in the second region 50Bb. Accordingly, a wiring density, which is a density of the wirings with respect to the total volume of the first region 50Ba, is higher than a wiring density which is a density of the wirings with respect to the total volume of the second region 50Bb. In the second region 50Bb, the row decoder 50B and the word line WL are connected only via the lowest metal layer closer to the substrate SB, a metal layer far from the substrate is removed, and the wiring region 82 is allocated. The wiring region 82 through which the signal lines 75, 76, 77, and 78 pass overlaps the second region 50Bb.

Figure 6:
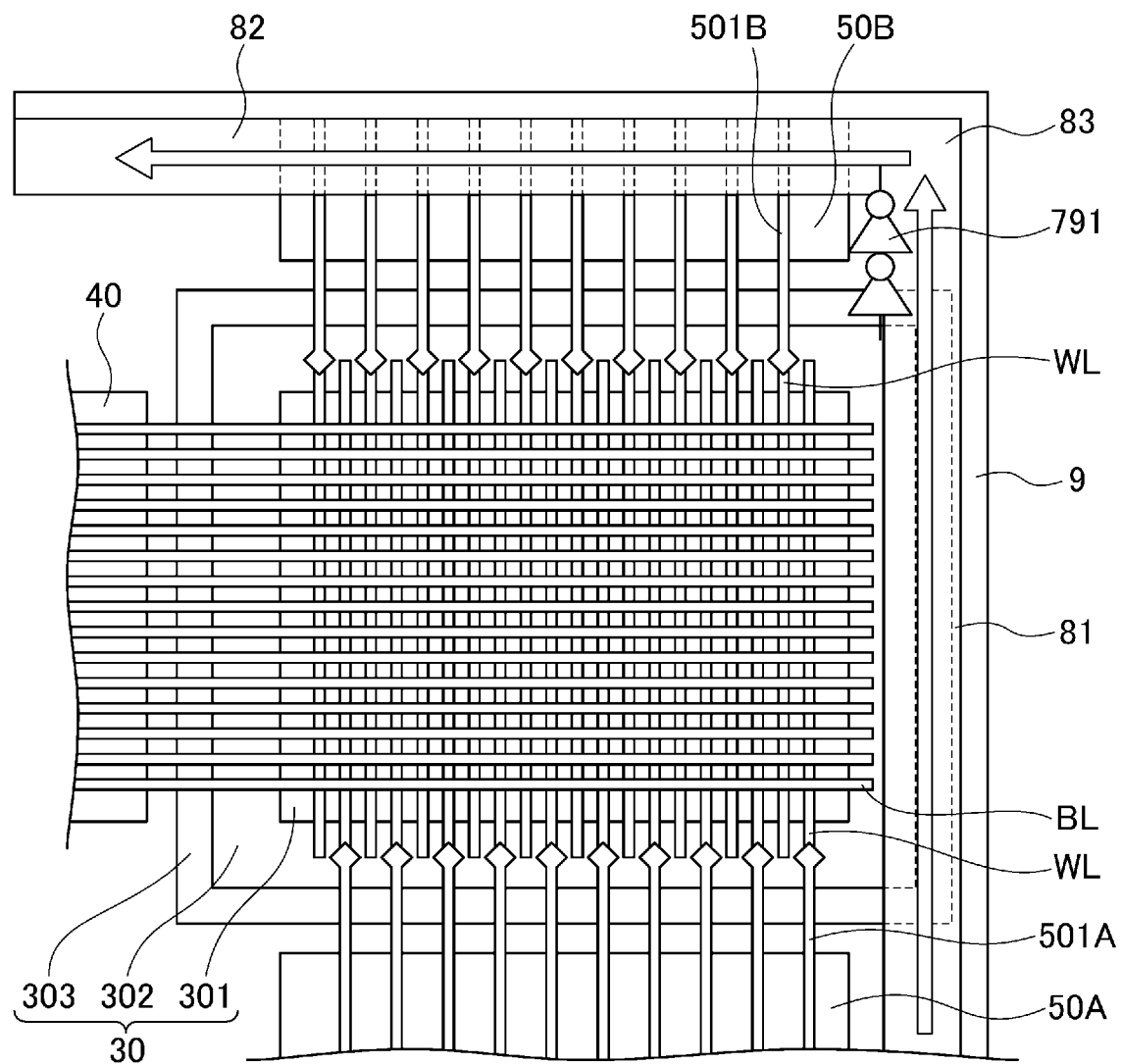
FIG. 6 is a diagram illustrating an example in which a logic circuit is provided in the wiring region.

As illustrated in FIG. 6, a buffer 791 may be provided in the wiring region 83 which is a corner portion connecting the wiring region 81 to the wiring region 82 as a kind of an arithmetic circuit.

Figure 7:
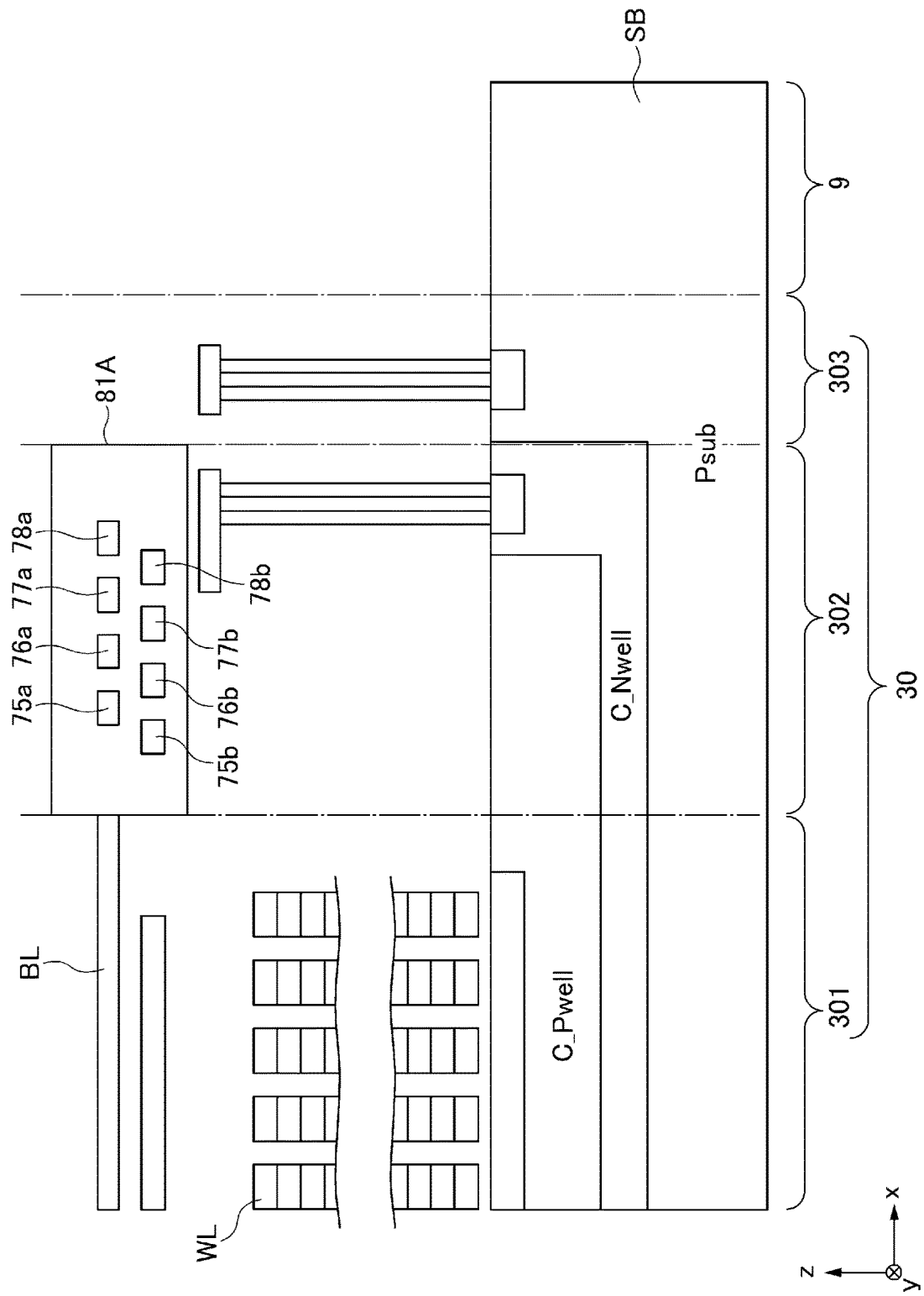
FIG. 7 is a diagram illustrating an example in which the wiring region is multiplexed.

FIG. 7 is a diagram illustrating a case where the IV portion of FIG. 3 is multi-layered and is a cross section which includes the x axis and the z axis. FIG. 7 is viewed from the negative direction to the positive direction of the y axis. As illustrated in FIG. 7, a multi-layered wiring region 81A can be provided. In the intermediate region 302 between the memory cell array 301 and the guard ring 303, the bit lines BL are not provided, and the wiring region 81A can be allocated by providing other wirings on the substrate SB side as much as possible. The wiring region 81A may include, for example, upper layer wirings such as signal lines 75a, 76a, 77a, and 78a and lower layer wirings such as signal lines 75b, 76b, 77b, and 78b.

Figure 8:
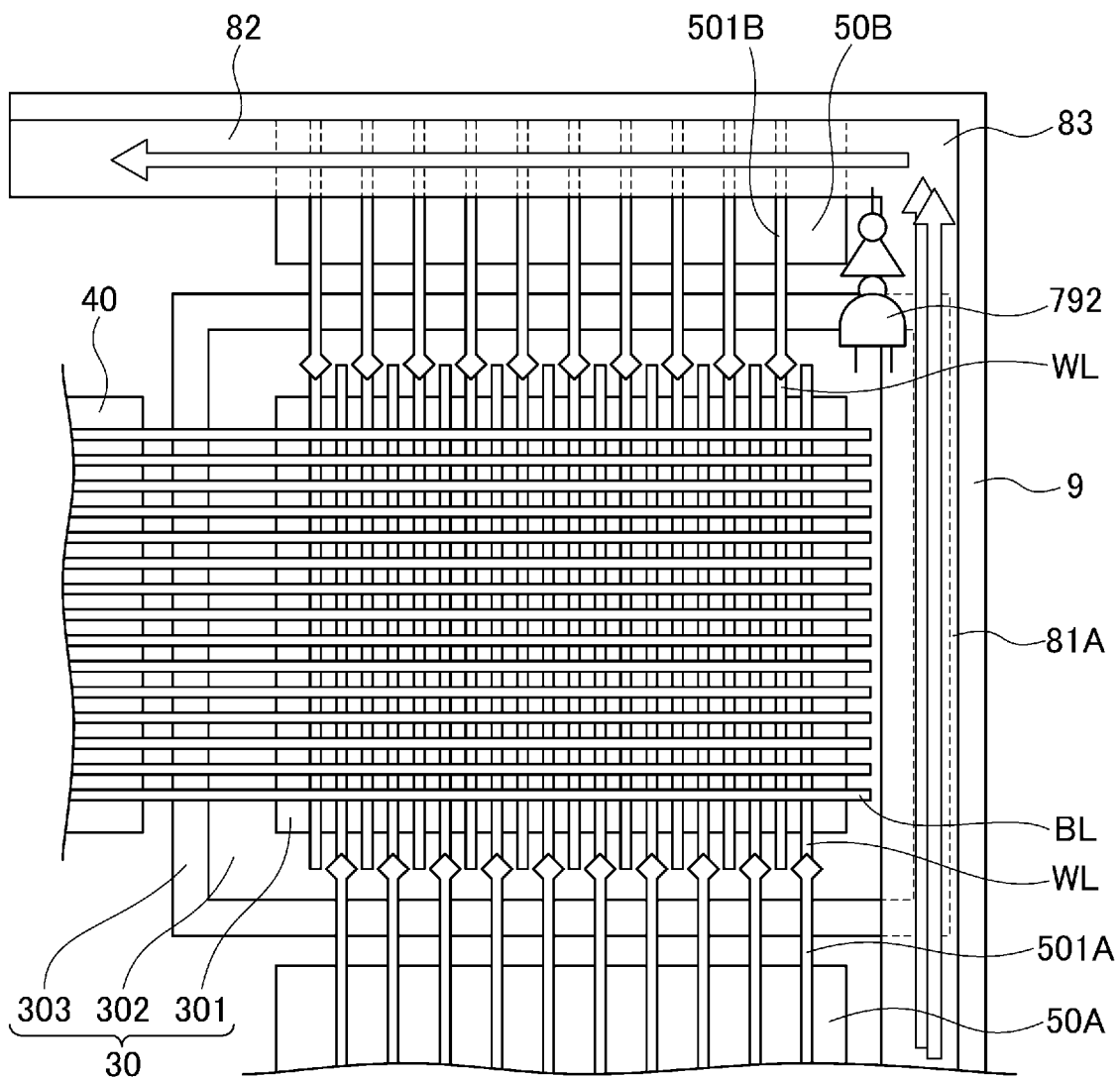
FIG. 8 is a diagram illustrating an example in which a logic circuit is provided in the wiring region illustrated in FIG. 7.

As illustrated in FIG. 8, a logic circuit 792 as a kind of an arithmetic circuit can be provided in the multi-layered wiring region 81A. Though the logic circuit 792 is a more complicated circuit than the buffer 791, a volume of the wiring region 81A is larger than the volume of the wiring region 81, and thus the logic circuit 792 can be inserted inside the wiring region 81A.

As described above, the NAND-type flash memory 2 as a semiconductor storage device includes the memory cell unit 3 that includes the memory cell array 301 including the plurality of memory cells (the planes 30, 31, 32, and 33), the peripheral circuit 6 that performs voltage transmission control including a write operation, a read operation, and an erasing operation with respect to the memory cell unit 3, and the signal lines 75, 76, 77, and 78 that connect the peripheral circuit 6 to the memory cell unit 3, and at least a portion of which passes through the wiring region 81, which is a non-facing region where a memory cell unit does not face the peripheral circuit 6, in a peripheral region excluding the memory cell array 301 of the memory cell unit 3. By causing the signal lines to pass through the non-facing region, signal restrictions such as interference with the bit line BL can be avoided without increasing the chip size.

The signal lines 75, 76, 77, and 78 pass through the region that overlaps the row decoder 50B controlling the word lines WL connected to the memory cell array 301 in a plan view. More specifically, the plan view is, for example, a plan view when being viewed from a direction of penetrating the xy plane where the planes 30, 31, 32, and 33 are provided in FIG. 2. From another viewpoint, the plan view is, for example, a plan view when being viewed from a direction of penetrating the xy plane where the row decoders 50A and 50B and the page buffer 40 are provided in FIG. 3. From another viewpoint, the plan view is, for example, a plan view when being viewed from a direction of penetrating the xy plane where the row decoders 50A and 50B and the memory cell array 301 are provided in FIG. 3.

The row decoder 50B may include the first region 50Ba having a high wiring density and the second region 50Bb having a wiring density lower than that of the first region 50Ba, and the signal lines 75, 76, 77, and 78 pass through a region that overlaps the second region 50Bb.

The signal lines 75, 76, 77, and 78 include a corner portion that is bent along the outer circumference of the memory cell array 301 which is the end portion of the wiring region 81 which is the non-facing region. The buffer 791 or the logic circuit 792 is provided at the corner portions as an arithmetic circuit.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a memory cell unit including a plurality of memory cell arrays;
   a peripheral circuit configured to perform voltage transmission control including a write operation, a read operation, and an erasing operation, with respect to the memory cell unit; and
   a plurality of signal lines connected to the peripheral circuit and the memory cell unit, at least a portion of the signal lines being formed in a non-facing region, the non-facing region being a region where the memory cell unit does not face the peripheral circuit, the non-facing region being in a peripheral region formed around a periphery of the memory cell arrays of the memory cell unit.

2. The semiconductor storage device according to claim 1, further comprising a row decoder, wherein the signal lines pass through a region that overlaps the row decoder, the row decoder configured to control word lines connected to the memory cell arrays in a plan view.

3. The semiconductor storage device according to claim 2, wherein the row decoder includes a first region and a second region, the second region having a lower wiring density than the first region, and wherein the signal lines pass through a region that overlaps the second region.

4. The semiconductor storage device according to claim 1, wherein the signal lines include a corner portion bent along an outer circumference of the memory cell arrays in an end portion of the non-facing region, and wherein an arithmetic circuit is disposed in the corner portion.

5. The semiconductor storage device according to claim 1, wherein the semiconductor storage device includes a NAND memory.

6. The semiconductor storage device according to claim 1, wherein the signal lines include upper layer wirings, and lower layer wirings below the upper layer wirings.

7. The semiconductor storage device according to claim 1, further comprising a bit line disposed on a same level as the non-facing region without overlapping the non-facing region.

8. The semiconductor storage device according to claim 3, further comprising a substrate and a word line over the substrate, wherein in the second region, the row decoder and the word line are connected only via a lower metal layer closest to the substrate.

9. The semiconductor storage device according to claim 4, wherein the arithmetic circuit includes a buffer.

10. The semiconductor storage device according to claim 4, wherein the arithmetic circuit includes a logic circuit.

11. The semiconductor storage device according to claim 1, wherein the signal lines include a corner portion bent along an outer circumference of the memory cell arrays in an end portion of the non-facing region.

\* \* \* \* \*